United States Patent

Healey, III et al.

[15] 3,697,890

[45] Oct. 10, 1972

[54] WIDE DEVIATION VOLTAGE CONTROLLED CRYSTAL OSCILLATOR WITH TEMPERATURE COMPENSATION

[72] Inventors: Daniel J. Healey, III; Michael M. Driscoll, both of Baltimore, Md.

[73] Assignee: The United States of America as represented by the Secretary of the Navy

[22] Filed: June 9, 1969

[21] Appl. No.: 831,486

[52] U.S. Cl. ..................331/116, 331/158, 331/176, 331/177

[51] Int. Cl. ..............................................H03b 5/32

[58] Field of Search....331/36 C, 109, 116, 158, 176, 331/177 V

[56] References Cited

UNITED STATES PATENTS

| | | | |
|---|---|---|---|
| 3,302,138 | 1/1967 | Brown et al. | 331/116 X |
| 3,358,244 | 12/1967 | Ho et al. | 331/116 |
| 3,523,258 | 8/1970 | Niemoeller et al. | 331/176 X |

*Primary Examiner*—Roy Lake
*Assistant Examiner*—Siegfried H. Grimm
*Attorney*—F. J. Brower, A. W. Collins and S. J. Bor

[57] ABSTRACT

A wide deviation voltage controlled oscillator having a tunable crystal filter utilizing a negative temperature coefficient coupling capacitance to produce a linear frequency change with any temperature change and a correcting diode controlled tuning voltage which is also a linear function of temperature to compensate for the linear frequency change and to automatically maintain frequency stability over a wide range of ambient temperatures.

8 Claims, 2 Drawing Figures

PATENTED OCT 10 1972 3,697,890

Figure 1:
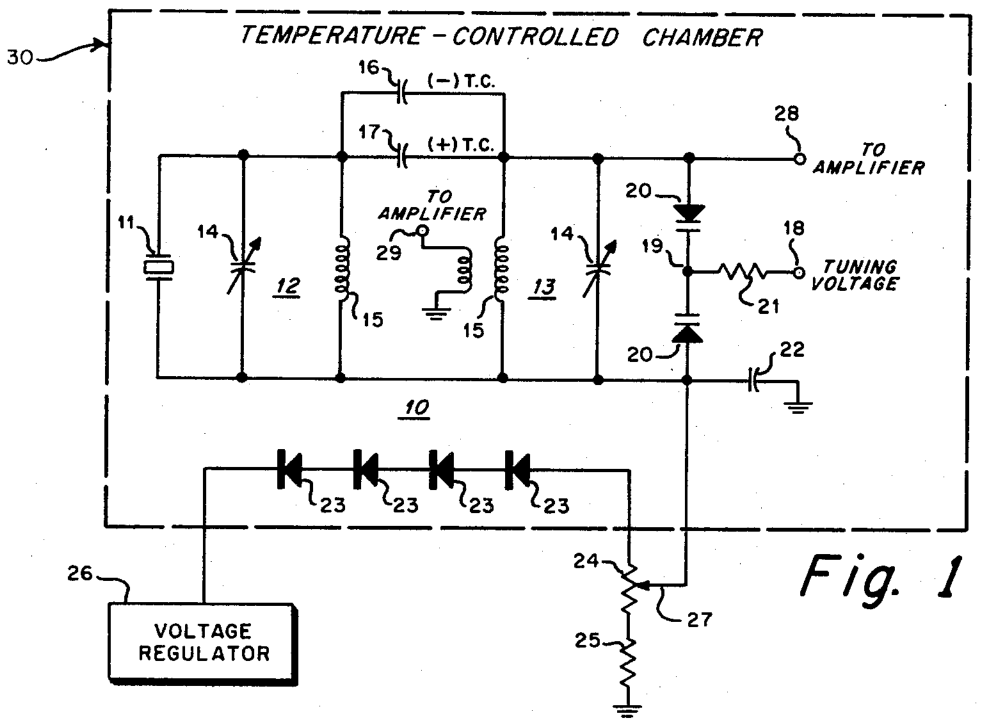

INVENTORS
DANIEL J. HEALEY, III
MICHAEL M. DRISCOLL

BY

Arthur L. Collins

ATTORNEY

WIDE DEVIATION VOLTAGE CONTROLLED CRYSTAL OSCILLATOR WITH TEMPERATURE COMPENSATION

The present invention relates generally to oscillators, and more particularly to voltage controlled crystal oscillator circuits incorporating a frequency compensation network to provide stable frequency of oscillation as the ambient temperature changes.

An oscillator, having initially been set at a particular frequency, will invariably drift and not maintain its selected frequency of oscillation. These deviations in frequency arise because the values of the circuit elements, on which the oscillator frequency depends, do not remain constant in time. The principal cause of drift in oscillator circuits is due to the variation of ambient temperature. Many special oscillator circuits have been designed to meet the requirement of essentially constant frequency over long periods of time. Among the best of these are circuit controlled by piezoelectric crystals, used in place of a resonant circuit in the oscillator. The crystal resonant frequency does, however, along with the other necessary circuit components, still depend somewhat on the temperature, and constant-temperature ovens must be employed where the highest stability and accuracy is required, as in military-aerospace applications. However, an additional difficulty encountered is that the ambient temperature in a typical application may range from −55° to +95° C, a range over which a constant temperature environment proves difficult to maintain with any degree of accuracy. No satisfactory solution to this problem has heretofore been obtained. While proportionally controlled ovens have been built to maintain crystal temperatures at a given value, the frame in which the oscillator is contained is constructed of extremely thick walls which produced a heavy, bulky package and most designs are, because of weight and space limitations, only accurate to within ±10° C of the chosen temperature. Also, these ovens, while minimizing variations of thermal gradients, provide a large thermal time constant which precludes a rapid warm-up time when a fixed amount of power to operate the oven is available.

According to the present invention, a voltage tunable crystal filter is utilized as the frequency determining circuit of a voltage controlled crystal oscillator (VCXO). The filter circuit has two capacitance-coupled parallel LC circuits coupled by a pair of parallel connected capacitors. The combined capacitance of the coupling capacitors exhibits a slightly overall stable negative temperature coefficient that compensates for the usually positive temperature coefficients of the remaining elements in the filter circuit, which results in a shift of the VCXO frequency versus voltage characteristic that is linearly related to the change in temperature. The linear change in the frequency versus voltage characteristics thus occurring is then compensated for by introducing a correcting tuning voltage which is a linear function of temperature to thereby provide a near constant frequency versus voltage characteristic over the range of ambient temperature extremes encountered. In a preferred embodiment of the present invention the necessary voltage is provided by the temperature dependent contact potential variation of a plurality of serially connected semiconductor diodes. The diodes are incorporated in a voltage divider arrangement with a variable bias resistor that is fed from a stable reference potential derived from a voltage regulator.

Accordingly, it is a principal object of the present invention to provide a novel and improved wide deviation voltage controlled crystal oscillator.

It is a more specific object of the present invention to provide a novel and improved voltage controlled oscillator circuit including a network for automatic compensation of frequency shift of the resonant circuit of the oscillator as the ambient temperature varies over a wide range.

A further object of the present invention is to provide a simple and efficient compensating network for improving the frequency stability of voltage controlled crystal oscillators.

A still further object of the present invention is to provide a novel and improved voltage tunable crystal filter circuit.

Figure 2:
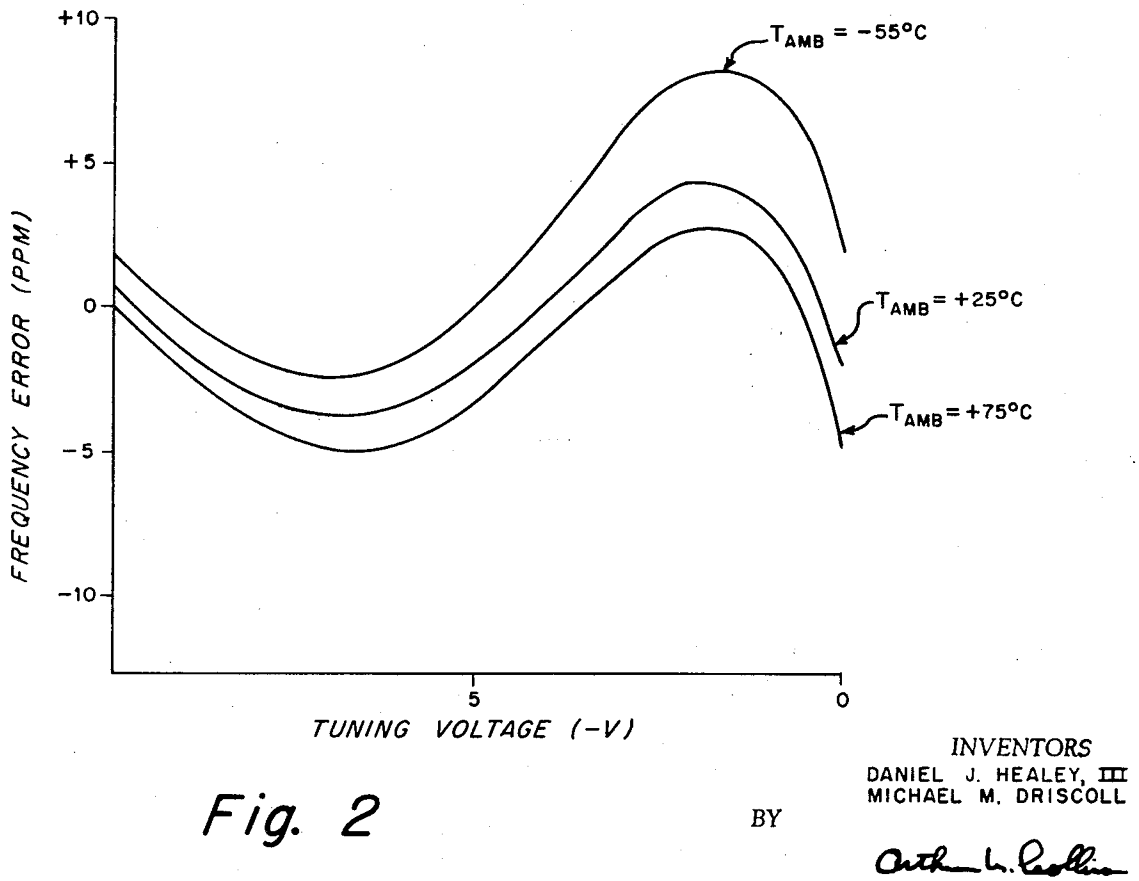

The above and still further objects, features and attendant advantages of the present invention will become apparent from a consideration of the following detailed description of a preferred embodiment thereof, especially when taken in conjunction with the accompanying drawing, in which:

FIG. 1 of the drawing is a schematic circuit diagram of a preferred embodiment of the VCXO according to the present invention; and FIG. 2 of the drawing is a graphical representation of the frequency accuracy of the present invention over a wide range of ambient temperatures.

Referring now to the drawing, the A-C circuit diagram of FIG. 1 represents the basic components of a voltage tunable crystal filter 10 used as the frequency determining circuit of a VCXO. Filter 10 comprises a piezoelectric crystal 11 which operates as the primary resonant circuit of the VCXO connected in parallel with a pair of capacitance-coupled parallel LC circuits 12 and 13. Each of the parallel LC circuits 12 and 13 comprises a variable capacitor 14 and an inductor 15, the composite resonant or filter circuit being tuned nominally to the center frequency of the crystal 11. The variable capacitors 14 are shunted across the crystal in order to obtain a fine adjustment of the frequency versus voltage characteristic by changing the capacitance of the equivalent electrical circuit. The parallel LC circuits 12 and 13 are connected together electrically by a pair of parallel connected coupling capacitors 16 and 17 selected to have an overall negative temperature coefficient, whose function will become more apparent hereinafter.

The center or resonant frequency of the crystal filter 10, is capable of being varied by a tuning voltage signal applied at terminal 18 through the resistor 21 to the junction 19 between a pair of serially connected voltage variable capacitors or tuning elements 20, for example, a pair of varactor diodes, which are reversed biased. The filter elements 11, 14, 15 and 20 each have their common junction point connected to ground through the D-C blocking capacitor 22.

An additional compensating circuit is provided, whose operation will become more apparent hereinafter, utilizing a linear temperature dependent voltage connected in series with the biasing potential for the voltage variable capacitors 20. The necessary voltage is provided by the temperature dependent contact potential variation of a plurality of semiconductor diodes 23 connected in series, preferably of the ordinary silicon type. The diodes 23 are incorporated in a voltage divider arrangement, connected in series with the variable biasing resistor 24 and the fixed resistance 25 to ground, which is fed from a stable reference potential 26, which is preferably a transistor-zener diode voltage regulator. The movable arm 27 of the variable resistor 24 is connected to the common junction of the filter circuit 10 and provides the necessary bias potential for the tuning elements 20. To complete the circuitry of the VCXO, the filter circuit 10 is connected to an amplifier (not shown) through the terminals 28 and 29, providing transformer-coupling to the amplifier, which may be of any suitable well known design, preferably comprising solid-state circuitry.

In state-of-the-art VCXO designs, regulation of the ambient temperature of the oscillator crystal to a temperature near its turnover temperature, where the crystal exhibits a minimum temperature coefficient, will maintain the VCXO frequency within the necessary accuracy provided no other component characteristics of the composite VCXO varies with temperature. However, it is well known that the temperature coefficient of the elements in the crystal filter circuitry, other than the crystal itself, are not negligible and cause a change in frequency with respect to a change in temperature that is not constant or linear at all frequencies in the VCXO tuning band.

In order to improve this condition, the capacitance needed to couple the pair of parallel LC circuits 12 and 13 together was provided as two capacitors, 16 and 17, connected in a parallel configuration. The capacitor 16 has a negative temperature coefficient and the capacitor 17 is a highly stable capacitor which has a positive or near zero temperature coefficient selected so that the combined capacitance exhibits a slightly overall stable negative temperature coefficient that compensates for the positive temperature coefficients of the remaining elements of the filter circuit 10. For example, in a typical circuit the value of the capacitor 16 is chosen so that it will contribute 0.446 of the total capacitance needed for proper coupling with a temperature coefficient equal to −300 PPM/° C while the value of the capacitor 17 is chosen to contribute 0.554 of the total capacitance with a temperature coefficient of +140 PPM/° C.

By utilizing the parallel coupling capacitance in the circuit of FIG. 1, the effect of temperature becomes a near equal shift of all VCXO tuning frequencies in a linear fashion over a range of approximately ±10° C near the temperature turnover point of the crystal 11. In a typical application, the frequency error from ideal VCXO characteristics was found to be approximately 2 PPM/° C over the entire tuning range of the oscillator. Optimum compensation of frequency shift with temperature change is achieved if the inductors 15 are wound on quartz formers with prestressed wire so that their temperature coefficients, although slightly positive, are negligible. In addition, the capacitor 17 is preferably constructed from twined quartz so that the negative temperature coefficient capacitor 16 will then be a much smaller part of the total coupling capacitance owing to the excellent stability and near zero temperature coefficient afforded by quartz capacitors.

Since the effect of temperature change on the filter 10 is to identically shift all frequencies in a linear manner when using a net negative temperature coefficient coupling capacitor alone, additional compensation is provided to obtain a constant frequency with respect to temperature change at all frequencies in the VCXO tuning band. This is accomplished by introducing a correcting tuning voltage signal which is a linear function of temperature. The necessary correcting voltage is provided by the temperature dependent contact potential variations of the semi-conductor diodes 23. The diodes 23 are connected in series with the biasing potential for the voltage variable capacitors 20 and are forward biased by the voltage regulator 26. All of the necessary components of the filter circuit 10 are enclosed in a temperature-controlled chamber 30, which attempts to stabilize the temperature near the temperature turnover point of the crystal 11, except for the biasing resistors 24 and 25 and the voltage regulator 26, which are exposed to the ambient temperatures. The linear variations of frequency caused by a change in temperature are then compensated for by utilizing the variation of contact potential in the forward biased diodes 23, to regulate the bias voltage applied to the common junction of the filter circuit 10. With an increase or a decrease in temperature the contact potential of the diodes 23 will decrease or increase, respectively, thereby increasing or decreasing the voltage applied across the bias resistor 24 which accordingly changes the bias for the tuning elements 20. It is to be noted that while four diodes 23 are shown, any number may be utilized. The number selected primarily depends upon the thermal behavior of the oven and its effect on the frequency determining circuitry. Also, any other well known suitable near linear temperature-sensitive elements, for example, thermistors, may be used in place of the diodes 23.

Referring now to FIG. 2 of the drawing, a graphical representation of the operation of a VCXO incorporating the present invention is shown. It can be seen that over the entire tuning range of the VCXO the frequency change is less than 5 PPM over an ambient temperature range of −55° to ±75° C that is, a frequency temperature coefficient of 1/25 PPM/° C, a substantial improvement in frequency accuracy over that provided by related prior art circuits. In addition, the variation in the change of frequency with change in temperature between different mechanical designs for models of the same electrical oscillator circuit can be simply compensated for by changing the number of diodes 23 used and by a corresponding fine adjustment of the variable resistor 24 to alter the temperature dependent compensating voltage required.

Obviously many modifications and variations of the present invention are possible in the light of the above teachings. It is therefore to be understood that, within the scope of the appended claims, the invention may be practiced otherwise than as specifically described.

What is claimed is:

1. A wide deviation voltage controlled crystal oscillator, comprising:

a. an amplifier;

b. a source of tuning voltage c. and a voltage tunable crystal filter circuit coupled to the amplifier and the voltage source to to effect oscillations of the oscillator over a range of frequencies about a predetermined center frequency, said filter circuit including a first frequency compensating network to produce a substantially linear change of frequency versus voltage characteristic with a change in ambient temperature and a second frequency compensating network to correct the linear change in frequency versus voltage characteristic and thereby provide a substantially constant frequency versus voltage characteristic independent of ambient temperature change.

2. A wide deviation voltage controlled crystal oscillator substantially as described in claim 1, wherein the voltage tunable crystal circuit further includes:

a. a piezoelectric crystal;

b. a pair of parallel LC circuits connected in parallel with the piezoelectric crystal, each of said parallel LC circuits having a variable capacitor and an inductor;

c. and a pair of series connected voltage variable capacitors connected in parallel with the parallel LC circuits, said tuning voltage applied at the junction between said voltage variable capacitors to vary the oscillator frequency.

3. A wide deviation voltage controlled crystal oscillator substantially as described in claim 2, wherein:

a. the first frequency compensating network includes a pair of parallel connected coupling capacitors coupled between a common junction of the pair of parallel LC circuits, the combined capacitance of said capacitors having a slightly negative temperature coefficient to compensate for the positive temperature coefficients of the other elements of the filter circuit, whereby the effect of temperature becomes a substantially identical shift of all tuning frequencies in a linear manner;

b. and wherein the second frequency compensating network includes means for producing a linear temperature dependent compensating voltage providing a correcting biasing potential to the pair of voltage variable capacitors.

4. A wide deviation voltage controlled crystal oscillator substantially as described in claim 3, wherein the compensating voltage producing means comprises:

a. a stable source of reference bias potential;

b. a plurality of forward biased semiconductor diodes connected in series with the stable reference potential, said diodes exhibiting a negative temperature coefficient of contact potential;

c. and a variable resistor connected in series with the semiconductor diodes, the voltage drop across said variable resistor providing the biasing potential for the voltage variable capacitors through the movable arm thereof.

5. A wide deviation voltage controlled crystal oscillator substantially as described in claim 4, wherein:

a. the elements of the crystal filter circuit except the source of reference potential and the variable resistor are enclosed in a temperature-controlled chamber whose mean temperature is at the temperature turnover point of the piezoelectric crystal;

b. and wherein the pair of coupling capacitors comprise a negative temperature coefficient capacitor and a highly stable positive or near zero temperature coefficient capacitor each contributing fractionally the total capacitance needed for the proper coupling of the pair of LC circuits.

6. A wide deviation voltage controlled crystal oscillator substantially as described in claim 5, wherein:

a. the inductors of said LC circuits are wound on quartz formers with prestressed wire so that their temperature coefficients are substantially negligible;

b. and the positive or near zero temperature coefficient capacitor of the pair of coupling capacitors is constructed from twined quartz.

7. In a voltage controlled crystal oscillator comprising an amplifier, a source of tuning voltage and a voltage tunable crystal filter circuit, wherein the oscillator is enclosed in a temperature-controlled chamber whose temperature is maintained near the temperature turnover point of the crystal, the improvement wherein said filter circuit comprises:

a. a pair of capacitance coupled parallel LC circuits connected in a parallel configuration with said crystal;

b. a pair of voltage variable capacitors for receiving the tuning voltage to produce oscillations over a range of frequencies about a predetermined center frequency;

c. a pair of parallel connected coupling capacitors coupling said LC circuits, one of said capacitors having a negative temperature coefficient and the other of said capacitors having a positive of near zero temperature coefficient, the combined capacitance of said capacitors having a slightly negative temperature coefficient whereby the frequency shift caused by a change in temperature of said chamber is linear;

d. and compensating means for correcting the linear change in frequency to produce a constant frequency for each tuned frequency, said compensating means comprising a voltage regulator, a plurality of forward biased semiconductor diodes connected serially with the voltage regulator and a variable resistor connected serially with the diodes, the voltage drop across said variable resistor providing a temperature dependent biasing potential for the voltage variable capacitors.

8. In a voltage controlled crystal oscillator substantially as described in claim 7, wherein:

a. each of the parallel LC circuits have a variable capacitor and an inductor connected in a parallel configuration;

b. and wherein said positive or near zero temperature coefficient capacitor is substantially stable and contributes fractionally to the total capacitance needed for the proper coupling of said LC circuits.

* * * * *